United States Patent
Seki et al.

(10) Patent No.: US 8,470,698 B2
(45) Date of Patent: Jun. 25, 2013

(54) METHOD FOR GROWING P-TYPE SIC SEMICONDUCTOR SINGLE CRYSTAL AND P-TYPE SIC SEMICONDUCTOR SINGLE CRYSTAL

(75) Inventors: Akinori Seki, Shizuoka-ken (JP); Yasuyuki Fujiwara, Shizuoka-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 273 days.

(21) Appl. No.: 12/864,687

(22) PCT Filed: Jan. 28, 2009

(86) PCT No.: PCT/IB2009/001040
§ 371 (c)(1), (2), (4) Date: Jul. 27, 2010

(87) PCT Pub. No.: WO2009/095764
PCT Pub. Date: Aug. 6, 2009

(65) Prior Publication Data
US 2010/0308344 A1 Dec. 9, 2010

(30) Foreign Application Priority Data
Jan. 29, 2008 (JP) ................................. 2008-018027

(51) Int. Cl.
*H01L 21/20* (2006.01)
(52) U.S. Cl.
USPC ............ 438/507; 257/E21.065; 257/E29.104; 257/77

(58) Field of Classification Search
USPC .............................................. 438/507; 257/77
See application file for complete search history.

(56) References Cited

U.S. PATENT DOCUMENTS

| | | | |
|---|---|---|---|
| 5,187,547 A * | 2/1993 | Niina et al. ...................... | 257/77 |
| 5,322,824 A * | 6/1994 | Chia ............................... | 501/89 |
| 5,433,167 A | 7/1995 | Furukawa et al. | |
| 5,718,760 A * | 2/1998 | Carter et al. .................... | 117/84 |

FOREIGN PATENT DOCUMENTS

| | | |
|---|---|---|
| CN | 1191580 | 8/1998 |
| EP | 1 403 404 A1 | 3/2004 |
| JP | 60-260498 | 12/1985 |
| JP | 5-221796 | 8/1993 |
| JP | 6-219898 | 8/1994 |

(Continued)

OTHER PUBLICATIONS

German Office Action for German Appl. No. 11 2009 000 196.3 dated Sep. 26, 2011.

(Continued)

*Primary Examiner* — A. Sefer
(74) *Attorney, Agent, or Firm* — Finnegan, Henderson, Farabow, Garrett & Dunner, LLP

(57) ABSTRACT

In a method for growing a p-type SiC semiconductor single crystal on a SiC single crystal substrate, using a first solution in which C is dissolved in a melt of Si, a second solution is prepared by adding Al and N to the first solution such that an amount of Al added is larger than that of N added, and the p-type SiC semiconductor single crystal is grown on the SiC single crystal substrate from the second solution. A p-type SiC semiconductor single crystal is provided which is grown by the method as described above, and which contains $1\times10^{20}$ $cm^{-3}$ of Al and $2\times10^{18}$ to $7\times10^{18}$ $cm^{-3}$ of N as impurities.

15 Claims, 1 Drawing Sheet

FOREIGN PATENT DOCUMENTS

| | | |
|---|---|---|
| JP | 2000-264790 | 9/2000 |
| JP | 2003-73194 | 3/2003 |
| JP | 2003-277193 | 10/2003 |
| JP | 2005-82435 | 3/2005 |
| JP | 2006-245128 | 9/2006 |
| JP | 2007-76986 | 3/2007 |
| JP | 2007-153719 | 6/2007 |
| WO | WO 2007/116315 A | 10/2007 |

OTHER PUBLICATIONS

"Foundations and Applications of SiC Devices," Power Electronics, K. Arai, ed., pp. 98-101 and 270 (Mar. 26, 2003).

H. Matsunami, "Technology of Semiconductor SiC and Its Application," pp. 114-119 (Mar. 31, 2003).

M. Ikeda et al., "Fabrication of 6H-SiC Light-Emitting Diodes by a Rotation Dipping Technique: Electroluminescence Mechanisms," J. Appl. Phys., vol. 50, No. 12, pp. 8215-8225 (Dec. 1979).

W. Münch et al., "Silicon Carbide Blue-Emitting Diodes Produced by Liquid-Phase Epitaxy," Solid-State Electronics, vol. 21, pp. 1129-1132 (1978).

M. Cooke, "Semiconductor Hardnut," III-Vs Review The Advanced Semiconductor Magazine, vol. 18, No. 9, pp. 40-44 (Dec./Jan. 2005/2006).

International Search Report in International Application No. PCT/IB2009/000140; Mailing Date: May 4, 2009.

Text of First Office Action for Chinese Appl. No. 200980103467.6 dated May 2, 2012.

\* cited by examiner

METHOD FOR GROWING P-TYPE SIC SEMICONDUCTOR SINGLE CRYSTAL AND P-TYPE SIC SEMICONDUCTOR SINGLE CRYSTAL

CROSS-REFERENCE TO RELATED APPLICATIONS

This application is a national phase application of International Application No. PCT/IB2009/000140, filed Jan. 28, 2009, and claims the priority of Japanese Application No. 2008-018027, filed Jan. 29, 2008, the contents of both of which are incorporated herein by reference.

BACKGROUND OF THE INVENTION

1. Field of Invention

The invention relates to a method for growing p-type SiC semiconductor single crystals, and also relates to p-type SiC semiconductor single crystals obtained by this method.

2. Description of the Related Art

SiC semiconductors have excellent properties, such as a higher withstand voltage than that of Si semiconductors, resistance to high temperatures, and reduced power loss or dissipation, and thus have been developed for practical use as high-voltage, large-current power semiconductors suitable for, for example, inverters. For example, MOSFETs (metal oxide semiconductor field effect transistors) and IGBTs (insulated gate bipolar transistors) that provide switching devices of inverters are required to have small ON resistance and high switching speed. Of n-type and p-type SiC semiconductors that constitute these transistors, n-type semiconductors are currently at a relatively advanced stage of development, whereas the development of p-type semiconductors is delayed, thus making it difficult or impossible to achieve low resistance suitable for practical use.

Typical examples of techniques for producing p-type SiC semiconductors include, for example, a sublimation process, ion-implantation, and liquid phase deposition or solution method. The sublimation process, which has been most widely used, provide wafers of, for example, 6H—SiC doped with B or Al, which have a resistivity of 2 to 10 Ωcm as experimental values, but commercial products actually manufactured by this process have a resistivity of 200 Ωcm or higher. While the practical level of the resistivity required to be possessed by the above-described switching devices is 0.5 Ωcm or lower, the resistivity of the SiC semiconductors produced by the sublimation process does not reach the practical level. This may be because 1) doping of SiC semiconductors with an impurity such as B or Al (i.e., introduction of an impurity, such as B or Al, into SiC semiconductors) is difficult, or (2) the activation energy of 4H—SiC is equal to 285 meV when it is doped with B and is equal to 190 meV when it is doped with Al ("Foundations and Applications of SiC Devices" edited by Kazuo ARM and published in 2003 by Ohmsha); because of such a large activation energy, activated carriers are less likely to be produced, i.e., the rate of generation of activated carriers is low.

By ion implantation, on the other hand, 6H—SiC, when doped at an impurity concentration of $10^{20}$ to $10^{21}$ cm$^{-3}$, provides an extremely low resistivity of 0.02 Ωcm ("Technology of Semiconductor SiC and Its Application" by Hiroyuki MATSUNAMI, published in 2003 by Nikkan Kogyo Shimbun Ltd.). If such a high impurity concentration or large doping amount is employed, crystal defects are inevitably generated, and high-quality semiconductor single crystals cannot be obtained. Also, the activation energy of 4H—SiC is equal to 285 meV when it is doped with B and is equal to 190 meV when it is doped with Al ("Foundations and Applications of SiC Devices" edited by Kazuo ARAI and published in 2003 by Ohmsha); because of such a large activation energy, activated carriers are less likely to be produced, i.e., the rate of generation of activated carriers is low, as is the case with the sublimation process.

The liquid phase deposition or solution method is conducive to an improvement in the polytype controllability and reduction of micropipes. Thus, various proposals have been made on this method.

Japanese Patent Application Publication No. 2000-264790 (JP-A-2000-264790) discloses a p-type SiC semiconductor single crystal obtained by adding Al or B into a solution in which C is dissolved in a melt of Si (which solution will be simply called "Si—C solution"), and an n-type SiC semiconductor single crystal similarly obtained by adding N to the Si—C solution. However, this publication does not particularly address reduction of the resistance.

In Japanese Patent Application Publication No. 2007-76986 (JP-A-2007-76986), it is proposed to grow a SiC semiconductor single crystal by adding Ti and Al to a Si—C solution. However, this publication does not particularly address reduction of the resistance.

In Japanese Patent Application Publication No. 2005-82435 (JP-A-2005-82435), it is proposed to improve the flatness of a growth surface of a SiC single crystal by adding 1 to 30 wt % of Al to a Si—C solution. However, this publication does not mention the amount of Al contained in the resultant SiC single crystal nor addresses reduction of the resistance.

In Japanese Patent Application Publication No. 2007-153719 (JP-A-2007-153719), it is proposed to deposit N on a porous graphite crucible so that N is add into a Si—C solution. Since N is an n-type dopant, the addition of only N does not result in production of a p-type SiC semiconductor single crystal. In this publication, there is no suggestion about reduction of the resistance.

SUMMARY OF THE INVENTION

The present invention provides a method for growing a p-type SiC semiconductor single crystal in which the resistivity is reduced down to a level suitable for practical use, and a p-type SiC semiconductor single crystal obtained by this method.

A first aspect of the invention is concerned with a method for growing a p-type SiC semiconductor single crystal on a SiC single crystal substrate, using a first solution in which C is dissolved in a melt of Si. In this method, a second solution is prepared by adding Al and N to the first solution such that an amount of Al added is larger than that of N added, and the p-type SiC semiconductor single crystal is grown on the SiC single crystal substrate from the second solution.

A second aspect of the invention provides a p-type SiC semiconductor single crystal which is grown by the method as described above, and which contains $1 \times 10^{20}$ cm$^{-3}$ of Al and $2 \times 10^{18}$ to $7 \times 10^{18}$ cm$^{-3}$ of N as impurities.

By adding Al and N to the Si—C solution in amounts that satisfy the relationship that the amount of Al added is larger than that of N, it is possible to grow a p-type SiC semiconductor single crystal whose resistivity is reduced to a level suitable for practical use.

In the method of the first aspect of the invention, the amounts of Al and N added to the Si—C solution are controlled to satisfy the relationship that the amount of Al added is larger than that of N, so that the p-type SiC semiconductor single crystal is grown on the SiC single crystal substrate.

In the method of the first aspect of the invention, Al as a p-type dopant and N as an n-type dopant are combined together and added to the Si—C solution. It is generally known in the art that, if a p-type dopant and an n-type dopant coexist, they may cancel each other out, resulting in an increase in the resistance value. Contrary to the common knowledge, the coexistence of Al and N according to the invention leads to a significant reduction in the resistance value, compared to the case where Al alone is added. The reason of the reduction has not been elucidated, but the resistance value may be reduced because 1) the manner of introducing Al into SiC is changed, and 2) the electric characteristics (such as the activation energy) are changed, due to the presence of N with Al.

In one embodiment of the invention, the growth of the p-type SiC semiconductor single crystal may take place in a mixed atmosphere of Ar and $N_2$. In this manner, N can be added into the solution.

In another embodiment of the invention, a transition metal may be further added to the solution. As a result, the resistance value can be further reduced. In this case, Cr or Ti may be typically used as the transition metal.

The liquid phase deposition or solution method includes not only "growth of single crystals" having a thickness of several hundreds of μm or several mm or larger, as will be explained later, but also "liquid-phase epitaxial growth", namely, formation of a thin film of several μm to several dozens of μm.

BRIEF DESCRIPTION OF THE DRAWINGS

The foregoing and further objects, features and advantages of the invention will become apparent from the following description of exemplary embodiments with reference to the accompanying drawing, wherein like numerals are used to represent like elements and wherein.

DETAILED DESCRIPTION OF THE PREFERRED EMBODIMENTS

Figure 1:
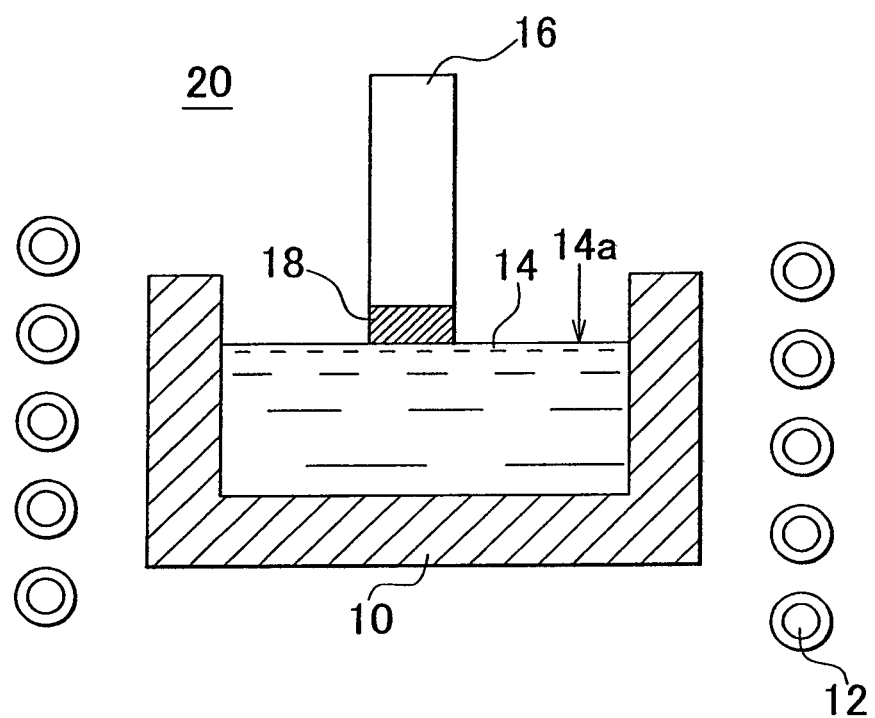
FIG. 1 is a schematic view showing the basic construction of an apparatus for growing p-type SiC semiconductor single crystals by liquid phase deposition according to the method of the invention.

In an embodiment of the invention, p-type SiC semiconductor single crystals were grown by liquid phase deposition under the following conditions, according to the following procedure.

FIG. 1 shows an apparatus used in this embodiment. A source material in a graphite crucible 10 was heated by high-frequency heating coils 12 that surround the graphite crucible 10, and was dissolved into a solution 14, and a SiC single crystal substrate 18 that is a SiC seed crystal supported at the lower end of a support member 16 was brought into contact with a liquid surface 14*a* of the solution 14, so that a SiC single crystal was grown on the lower surface of the SiC single crystal substrate 18 in an inert atmosphere 20 of, for example, Ar gas.

To provide the source material, Si, Al, Cr and Ti were mixed together in various amounts as indicated in TABLE 1, and the resultant mixture, was charged into the graphite crucible 10. Samples No. 1 to No. 3 are examples of this invention, and Sample No. 4 is a comparative example. In all of the examples, the proportion (or content) of Al in the source material was equal to a constant value of 10 at %.

The apparatus was charged with an atmosphere 20 of an Ar+$N_2$ mixed gas produced by adding 100 ppm of $N_2$ gas to Ar gas. In Sample No. 4 (Comparative Example) in which only Al was added as a dopant, an atmosphere of Ar gas mixed with no $N_2$ was used.

The source material was heated to a growth temperature of 1700 to 2000° C. and dissolved into the solution 14, and the SiC single crystal substrate 18 in the form of 6H—SiC was dipped into and held at the liquid surface 14*a* of the solution 14.

In the above conditions, a SiC single crystal was grown over a period of about 10 hours at a growth rate of 0.1 to 0.2 mm/hour. The resultant SiC single crystal was cut into slices each having a thickness of 600 μm, and Hall effect measurements were conducted. The results of measurements are indicated in TABLE 1 below.

TABLE 1

|  |  | Examples of the Invention | | | Com. Ex. |
|---|---|---|---|---|---|
| Sample No. |  | 1 | 2 | 3 | 4 |
| Dopant(s) |  | Al + N | Al + N + Cr | Al + N + Ti | Al |
| Proportions of Elements in Source Material (*1) | Si at % | 90 | 50 | 70 | 90 |
|  | Al at % | 10 | 10 | 10 | 10 |
|  | N ppm | 100 | 100 | 100 | — |
|  | Cr at % | — | 40 | — | — |
|  | Ti at % | — | — | 20 | — |
| Resistivity (Ωcm) |  | 0.25 | 0.03 | 0.07 | 0.7 |
| Carrier Concentration ($cm^{-3}$) |  | $3.4 \times 10^{19}$ | $9.2 \times 10^{19}$ | $2.7 \times 10^{19}$ | $1.0 \times 10^{19}$ |
| Impurity Concentration ($cm^{-3}$) (*2) | Al | $1 \times 10^{20}$ | $1 \times 10^{20}$ | $1 \times 10^{20}$ | $2\text{-}10 \times 10^{19}$ |
|  | N | $2\text{-}7 \times 10^{18}$ | $2\text{-}7 \times 10^{18}$ | $2\text{-}7 \times 10^{18}$ | $<1 \times 10^{15}$ |
|  | Cr | — | $1 \times 10^{17}$ | — | — |
|  | Ti | — | — | $4 \times 10^{16}$ | — |

(*1) The amounts of Si, Al, Cr and Ti are represented by the proportions (at %) of the respective elements in the sum of these elements charged into the crucible. The amount of N is represented by its concentration (ppm) in an Ar atmosphere.

(*2) The impurity concentration was measured by SIMS.

The resistivity of Sample No. 4 (comparative example), to which only Al was added, was 0.7 Ωcm, which is lower than 1 to 5 Ωcm achieved by the conventional sublimation process, but is still higher than a desired level of 0.5 Ωcm or lower as a level suitable for practical use.

On the other hand, all of Samples No. 1 to No. 3 as examples of the invention satisfy the desired level of 0.5 Ωcm or lower as the practical level. More specifically, the resistivity of Sample No. 1, to which Al and N were added as dopants, was 0.25 Ωcm, and the resistivity of Sample No. 2, to which Cr was further added as a dopant, was at such a low level as 0.03 Ωcm, while the resistivity of Sample No. 3, to which Ti was further added as a dopant, was at such a low level of 0.07 Ωcm.

In the examples of the invention, the addition of N as well as Al and further addition of Cr or Ti result in a reduction of the resistivity to a level lower than that of the case where only Al is added as a dopant. The reason why the resistivity is reduced has not been elucidated, but the following guesses may be made as described above. Namely, the resistance value may be lowered because 1) the manner of introducing Al into SiC is changed, and 2) the electric characteristics (such as the activation energy) are changed, due to the addition of N and Cr/Ti.

While the amount of N charged into the crucible (i.e., the concentration of N in the Ar atmosphere) was 100 ppm in the examples of the invention, the N concentration may be varied. It is, however, desirable that the percentage of N (the N concentration) in the Ar atmosphere is less than 10%. It is found from experiments conducted by the inventor(s) that crystal grains (foreign matters) derived from SiN are generated on a surface of a grown SiC single crystal when the percentage of N in the atmosphere is 10% or greater; therefore, a high-quality SiC single crystal can be obtained if the percentage of N is equal to or less than 10%. It is also desirable that the charge amount of N is 2 ppm or larger for the following reason. Namely, the effect of reducing the resistance is confirmed when N/Al is equal to or larger than 2% (N/Al≧2%), and the Al concentration is within an applicable range of impurity concentration when it is equal to or greater than $1 \times 10^{18}$ cm$^{-3}$ (Al≧$1 \times 10^{18}$ cm$^{-3}$). Therefore, the lower limit of the N concentration is equal to or higher than $2 \times 10^{16}$ cm$^{-3}$, and the charge amount of N (N concentration in the Ar atmosphere) that provides this concentration is equal to or greater than 2 ppm.

The presence of Al—N bonds may be considered as a mechanism of reduction of the resistance due to addition of the combination of Al and N. Since the effect of reducing the resistance is confirmed through experiments when N is added at a concentration of $2 \times 10^{18}$ cm$^{-3}$ relative to $1 \times 10^{20}$ cm$^{-3}$ of Al, the concentration of N is presumably required to be equal to or higher than $1 \times 10^{18}$ cm$^{-3}$ so as to ensure the effect of reducing the resistance of the P layer (p-type SiC semiconductor single crystal).

While the graphite crucible was used for the growth of silicon carbide single crystals in the above-described embodiment and examples, a crucible may be another crucible such as a ceramic crucible etc. In this case, carbon is supplied to such a crucible.

While the invention has been described with reference to example embodiments thereof, it is to be understood that the invention is not limited to the described embodiments or constructions. To the contrary, the invention is intended to cover various modifications and equivalent arrangements. In addition, while the various elements of the example embodiments are shown in various combinations and configurations, other combinations and configurations, including more, less, or only a single element, are also within the spirit and scope of the invention.

The invention claimed is:

1. A method for growing a p-type SiC semiconductor single crystal on a SIC single crystal substrate, using a solution in which C is dissolved in a melt of Si, comprising:
   preparing a second solution by adding Al and N to a first solution in which C is dissolved in a melt of Si such that an amount of Al added is larger than that of N added; and
   growing the p-type SiC semiconductor single crystal on the SIC single crystal substrate from the second solution.

2. The method according to claim 1, wherein the p-type SiC semiconductor single crystal is grown by contacting the SIC single crystal substrate with the second solution.

3. The method according to claim 1, wherein N is added from an atmosphere of $N_2$ into the first solution, to provide the second solution.

4. The method according to claim 1, wherein the p-type SiC semiconductor single crystal is grown in a mixed atmosphere of Ar and $N_2$.

5. The method according to claim 4, wherein a concentration of N in the mixed atmosphere is less than 10%.

6. The method according to claim 4, wherein the concentration of N in the mixed atmosphere is equal to or greater than 2 ppm.

7. The method according to claim 6, wherein the concentration of N in the mixed atmosphere is 100 ppm.

8. The method according to claim 1, further comprising:
   further adding a transition metal to the second solution.

9. The method according to claim 8, wherein the transition metal is Cr.

10. The method according to claim 9, wherein the amount of Cr added is 40 at % as an atomic percentage of Si, Al and Cr.

11. A p-type SIC semiconductor single crystal which is grown by the method as defined in claim 9, and which contains $1 \times 10^{20}$ cm$^{-3}$ of Al, $2 \times 10^{18}$ to $7 \times 10^{18}$ cm$^{-3}$ of N, and $1 \times 10^{17}$ cm$^{-3}$ of Cr as impurities.

12. The method according to claim 8, wherein the transition metal is Ti.

13. The method according to claim 12, wherein the amount of Ti added is 20 at % as an atomic percentage of Si, Al and Ti.

14. A p-type SiC semiconductor single crystal which is grown by the method as defined in claim 12, and which contains $1 \times 10^{20}$ cm$^{-3}$ of Al, $2 \times 10^{18}$ to $7 \times 10^{18}$ cm$^{-3}$ of N, and $4 \times 10^{16}$ cm$^{-3}$ of Ti as impurities.

15. A p-type SiC semiconductor single crystal which is grown by the method as defined in claim 1, and which contains $1 \times 10^{20}$ cm of Al and $2 \times 10^{18}$ to $7 \times 10^{18}$ cm$^{-3}$ of N as impurities.

* * * * *

UNITED STATES PATENT AND TRADEMARK OFFICE
CERTIFICATE OF CORRECTION

| | | |
|---|---|---|
| PATENT NO. | : 8,470,698 B2 | Page 1 of 1 |
| APPLICATION NO. | : 12/864687 | |
| DATED | : June 25, 2013 | |
| INVENTOR(S) | : Akinori Seki and Yasuyuki Fujiwara | |

It is certified that error appears in the above-identified patent and that said Letters Patent is hereby corrected as shown below:

Title page, item (86), "PCT/IB2009/001040" should read --PCT/IB2009/000140--.

Signed and Sealed this
Twenty-ninth Day of April, 2014

Michelle K. Lee
*Deputy Director of the United States Patent and Trademark Office*